(12) United States Patent
Fujimoto et al.

(10) Patent No.: US 11,369,996 B2
(45) Date of Patent: Jun. 28, 2022

(54) VIBRATION DEVICE AND IMAGING UNIT INCLUDING VIBRATION DEVICE

(71) Applicant: Murata Manufacturing Co., Ltd., Nagaokakyo (JP)

(72) Inventors: Katsumi Fujimoto, Nagaokakyo (JP); Yuuki Ishii, Nagaokakyo (JP); Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 17/137,504

(22) Filed: Dec. 30, 2020

(65) Prior Publication Data

US 2021/0154702 A1    May 27, 2021

Related U.S. Application Data

(63) Continuation of application No. PCT/JP2020/024812, filed on Jun. 24, 2020.

(30) Foreign Application Priority Data

Nov. 22, 2019 (JP) .............................. JP2019-211261

(51) Int. Cl.
| | |
|---|---|
| *B06B 1/06* | (2006.01) |
| *G02B 7/02* | (2021.01) |
| *G03B 17/02* | (2021.01) |
| *B06B 1/02* | (2006.01) |
| *H04N 5/225* | (2006.01) |
| *H01L 41/09* | (2006.01) |
| *G03B 17/56* | (2021.01) |

(52) U.S. Cl.
CPC .......... *B06B 1/0655* (2013.01); *B06B 1/0207* (2013.01); *G02B 7/02* (2013.01); *G03B 17/02* (2013.01); *G03B 17/56* (2013.01); *H01L 41/0926* (2013.01); *H04N 5/2251* (2013.01)

(58) Field of Classification Search
CPC . B06B 1/0207; B06B 1/0655; G02B 27/0006; G02B 7/02; G02B 7/026; G03B 17/02; G03B 17/08; G03B 17/56; G03B 30/00; H01L 41/09; H04N 5/2251; H04N 5/22521

See application file for complete search history.

(56) References Cited

U.S. PATENT DOCUMENTS

| | | | |
|---|---|---|---|
| 2007/0183771 A1* | 8/2007 | Takanashi .............. | G03B 17/02 396/429 |
| 2009/0262232 A1* | 10/2009 | Kim ....................... | G02B 7/102 348/340 |
| 2010/0085474 A1* | 4/2010 | Morita ................. | H04N 5/2251 348/374 |
| 2017/0046818 A1* | 2/2017 | Kiyamura ............ | G02B 27/646 |
| 2019/0113744 A1* | 4/2019 | Magee ................... | B08B 7/026 |
| 2020/0038914 A1* | 2/2020 | Fujimoto ............... | G03B 17/08 |
| 2021/0296558 A1* | 9/2021 | Englund ................ | H01L 41/09 |

* cited by examiner

*Primary Examiner* — Amy R Hsu
(74) *Attorney, Agent, or Firm* — Keating & Bennett, LLP

(57) ABSTRACT

A vibration device includes a protective cover, a first cylindrical body, a plate spring, a second cylindrical body, a piezoelectric element, and a vibrating plate. The vibration device further includes a non-equilibrium structure that removes a mass of a portion of or adds a mass to at least one of the protective cover, the first cylindrical body, the plate spring, the second cylindrical body, and the vibrating plate.

20 Claims, 11 Drawing Sheets

VIBRATION DEVICE AND IMAGING UNIT INCLUDING VIBRATION DEVICE

CROSS REFERENCE TO RELATED APPLICATIONS

This application claims the benefit of priority to Japanese Patent Application No. 2019-211261 filed on Nov. 22, 2019 and is a Continuation Application of PCT Application No. PCT/JP2020/024812 filed on Jun. 24, 2020. The entire contents of each application are hereby incorporated herein by reference.

BACKGROUND OF THE INVENTION

1. Field of the Invention

The present invention relates to a vibration device and an imaging unit including the vibration device.

2. Description of the Related Art

In recent years, in a vehicle equipped with an imaging unit including an imaging element or the like in a front portion or a rear portion of a vehicle, a safety device is controlled by using an image obtained by the imaging unit, or an automatic driving control is performed. Since such an imaging unit is often provided outside a vehicle, foreign matter, such as raindrops (water droplets), mud, dust, and the like, may adhere to a light transmissive body (a protective cover or a lens) that covers an exterior of the imaging unit. When the foreign matter adheres to the light transmissive body, the attached foreign matter is reflected on the image obtained by the imaging unit, and a sharp image cannot be obtained.

Therefore, an imaging unit described in Japanese Patent No. 6579200 is provided with a vibration device for vibrating a light transmissive body in order to remove foreign matter adhering to a surface of the light transmissive body. The vibration device includes a support body, a first vibration element arranged on one main surface side of the support body, and a second vibration element arranged on the other main surface side. The vibration device vibrates a second vibrating body provided with a piezoelectric vibrator to thereby vibrate a first vibrating body having a light-transmitting property, and thus removes foreign matter adhering to the surface of the light transmissive body.

In addition, an imaging unit described in International Publication No. WO2017/110563 includes, in order to vibrate a lens cover that covers one cavity of a cylindrical vibrating body, a vibration device in which a cylindrical mode conversion coupling portion is provided between the cylindrical vibrating body and a light transmissive body portion of the lens cover.

The imaging units described in Japanese Patent No. 6579200 and International Publication No. WO2017/110563 are based on the premise that the vibration device using a vibration mode for displacing an in-plane portion of the light transmissive body is provided. Therefore, in the imaging units described in Japanese Patent No. 6579200 and International Publication No. WO2017/110563, the light transmissive body is vibrated by using the vibration device so that an in-plane portion of the light transmissive body differs in displacement from another portion. Specifically, when vibrating the light transmissive body in a certain vibration mode, the vibration device vibrates the light transmissive body so that a central portion of the light transmissive body has a maximum displacement.

In a case where the central portion of the light transmissive body is vibrated so as to have the maximum displacement, the vibration device can move the raindrops adhering to the surface of the light transmissive body to the central portion of the light transmissive body and atomize the raindrops. That is, since a position where the displacement of the light transmissive body is large becomes hydrophilic by causing the vibration device to vibrate the light transmissive body, it is possible to move the raindrop at a position where the displacement is small to a position where the displacement is large by a surface tension difference. However, an amount of raindrops that can move on the light transmissive body by the vibration device depends on the distance from the position of the maximum displacement and a magnitude of the maximum displacement, and an ability to remove raindrops (foreign matter) greatly changes depending on the vibration mode of the vibration device. Further, the vibration device collects raindrops (foreign matter) at the position of the light transmissive body having the maximum displacement, and thus there has been a concern that the field of view at the position may be obstructed until the collected raindrops (foreign matters) are atomized. Further, the vibration device has a maximum displacement in the plane of the light transmissive body, and therefore it has been difficult to discharge raindrops (foreign matter) outside the light transmissive body by a method other than atomization caused by the vibration.

SUMMARY OF THE INVENTION

Preferred embodiments of the present invention provide vibration devices that are each capable of discharging foreign matter adhering to a light transmissive body outside the light transmissive body while maintaining a field of view of the light transmissive body, and imaging units each including a vibration device.

A vibration device according to a preferred embodiment of the present invention includes a light transmissive body that transmits light with a predetermined wavelength, a first cylindrical body that holds the light transmissive body at one end, a plate-shaped spring portion that supports another end of the first cylindrical body, a second cylindrical body that supports, at one end, a portion of the spring portion in an outer side portion of a portion that supports the first cylindrical body, a vibrating body that is provided at another end of the second cylindrical body and vibrates in an axial direction of the second cylindrical body, and a non-equilibrium structure that removes a mass of a portion or adds a mass to a portion of at least one of the light transmissive body, the first cylindrical body, the second cylindrical body, the spring portion, and the vibrating body.

An imaging unit according to a preferred embodiment of the present invention includes a vibration device according to a preferred embodiment of the present invention and an imaging element provided such that the light transmissive body is in a field of view of the imaging element.

According to preferred embodiments of the present invention, vibration devices and imaging units each including a vibration device include a non-equilibrium structure that removes a mass of a portion or adds a mass to a portion of at least one of a spring portion and a vibrating body, so that it is possible to discharge foreign matter adhering to a light transmissive body outside the light transmissive body while maintaining the field of view of the light transmissive body.

The above and other elements, features, steps, characteristics and advantages of the present invention will become

DETAILED DESCRIPTION OF THE PREFERRED EMBODIMENTS

Figure 1:
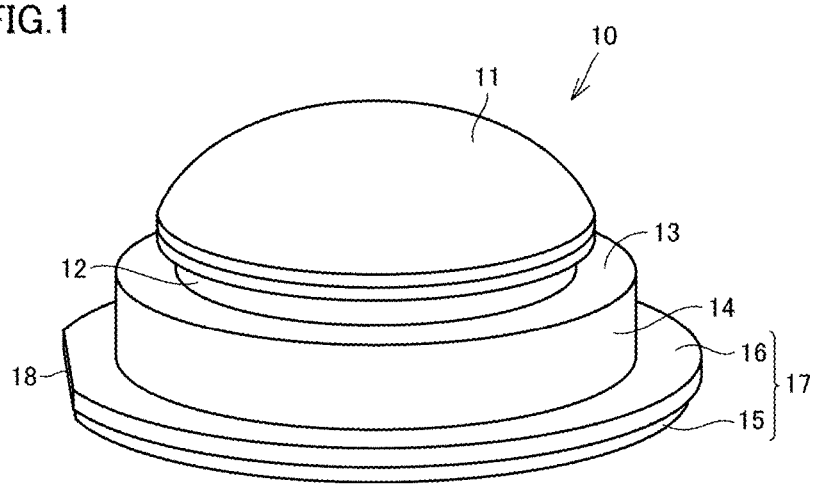
FIG. 1 is a perspective view of a vibration device according to Preferred Embodiment 1 of the present invention.

Optical units according to preferred embodiments of the present invention will be described in detail with reference to the drawings. Note that the same reference numerals in the drawings denote the same or corresponding element and portions.

Preferred Embodiment 1

Hereinafter, a vibration device and an imaging unit including the vibration device according to Preferred Embodiment 1 of the present invention will be described with reference to the drawings. FIG. 1 is a perspective view of a vibration device 10 according to Preferred Embodiment 1. The vibration device 10 includes a protective cover 11, a first cylindrical body 12, a plate spring 13, a second cylindrical body 14, and a vibrating body 17.

The protective cover 11 preferably has a dome shape. The protective cover 11 includes a transparent member as a light transmissive body that transmits light with a predetermined wavelength. An end portion of the protective cover 11 is held by an end portion of the first cylindrical body 12 having a cylindrical shape. The first cylindrical body 12 is supported by the plate spring 13 that elastically deforms on a side opposite to the protective cover 11 side. The plate spring 13 supports a bottom surface of the cylindrical first cylindrical body 12, and extends outward from the supported position. The plate spring 13 has a hollow circular or substantially circular shape, and surrounds a circumference of the first cylindrical body 12 having a circular or substantially circular shape.

The plate spring 13 is supported by the second cylindrical body 14 at a portion on an outer side portion of a portion that supports the first cylindrical body 12. The second cylindrical body 14 has a cylindrical shape. The second cylindrical body 14 supports the plate spring 13 at one end thereof. The vibrating body 17 is provided at the other end of the second cylindrical body 14. The vibrating body 17 vibrates in an axial direction of the second cylindrical body 14 (in a vertical direction in FIG. 1). The vibrating body 17 includes a piezoelectric element 15 and a vibrating plate 16. The piezoelectric element 15 has a hollow circular or substantially circular shape and is provided on a lower surface of the vibrating plate 16. The vibrating plate 16 supports a bottom surface of the second cylindrical body 14 and extends outward from the supported position. The vibrating plate 16 has a hollow circular or substantially circular shape, and surrounds a circumference of the second cylindrical body 14 having a circular or substantially circular shape. The piezoelectric element 15 vibrates in the axial direction of the second cylindrical body 14, such that the vibrating plate 16 vibrates in the axial direction of the second cylindrical body 14. Note that a plurality of rectangular or substantially rectangular piezoelectric elements 15 may be concentrically provided on the lower surface of the vibrating plate 16. In addition, the piezoelectric element 15 having a hollow circular or substantially circular shape may be provided on an upper surface of the vibrating plate 16. In addition, the plurality of rectangular or substantially rectangular piezoelectric elements 15 may be concentrically provided on the upper surface of the vibrating plate 16. Further, the piezoelectric element 15 may have a shape corresponding to the shape of the vibrating plate 16, and the piezoelectric element 15 and the vibrating plate 16 may be integrally provided.

Further, a cutout portion 18 is provided in a portion of the vibrating body 17. The cutout portion 18 is formed by cutting out a portion of the vibrating body 17, and in FIG. 1, the cutout portion 18 is formed by cutting out a portion of the vibrating body 17 on the left side in FIG. 1. The cutout portion 18 is provided in the vibrating body 17 to cause unbalance in the vibration of the vibration device 10, so that it is possible to vibrate the protective cover 11 in a non-equilibrium state as will be described later. The cutout portion 18 is one of a non-equilibrium element to vibrate the protective cover 11 in a state in which the vibration device 10 is in the non-equilibrium state.

The first cylindrical body 12, the plate spring 13, the second cylindrical body 14, and the vibrating plate 16 are integrally provided. The first cylindrical body 12, the plate spring 13, the second cylindrical body 14, and the vibrating plate 16 are preferably made of, for example, metal or synthetic resin. Note that the first cylindrical body 12, the plate spring 13, the second cylindrical body 14, and the vibrating plate 16 may be separately provided, or may be provided as separate members. A method of joining the protective cover 11 and the first cylindrical body 12 is not particularly limited. The protective cover 11 and the first cylindrical body 12 may be joined to each other by an adhesive, welding, fitting, press-fitting, or the like, for example.

In Preferred Embodiment 1, the protective cover 11 is preferably made of glass. However, the protective cover 11 may be made of, for example, a resin such as a transparent plastic, not limited to glass. Alternatively, the protective cover 11 may be made of a light transmissive ceramic material, for example. However, depending on the application, it is preferable to use tempered glass, such that the strength can be increased. In the case of the resin, the protective cover 11 may be an acrylic, a cycloolefin, a polycarbonate, a polyester, or the like, for example. Further, the protective cover 11 may include a coating layer made of diamond-like carbon (DLC) or the like, for example, provided on the surface thereof so as to increase the strength, and a coating layer such as a hydrophilic film, a water-repellent film, a lipophilic film, an oil-repellent film, or the like, for example, may be provided to prevent contamination of the surface, remove raindrops, and the like.

The dome shape of the protective cover 11 is not limited to a hemispherical shape. A shape obtained by connecting a cylinder to a hemisphere, a curved shape smaller than the hemisphere, or the like, for example, may be included. The protective cover 11 may be a flat plate. It does not matter whether the light transmitted through the protective cover 11 is visible light or invisible light. The protective cover 11 may be, for example, a cover made of glass, or may be made of an optical component such as a concave lens, a convex lens, or a flat lens.

The piezoelectric element 15 vibrates, for example, by polarizing in a thickness direction. The piezoelectric element 15 is preferably made of lead zirconate titanate-based piezoelectric ceramics, for example. However, other piezoelectric ceramics, such as (K, Na) NbO$_3$, for example, may be used. Further, a piezoelectric single crystal, such as LiTaO$_3$, for example, may be used.

Figure 2:
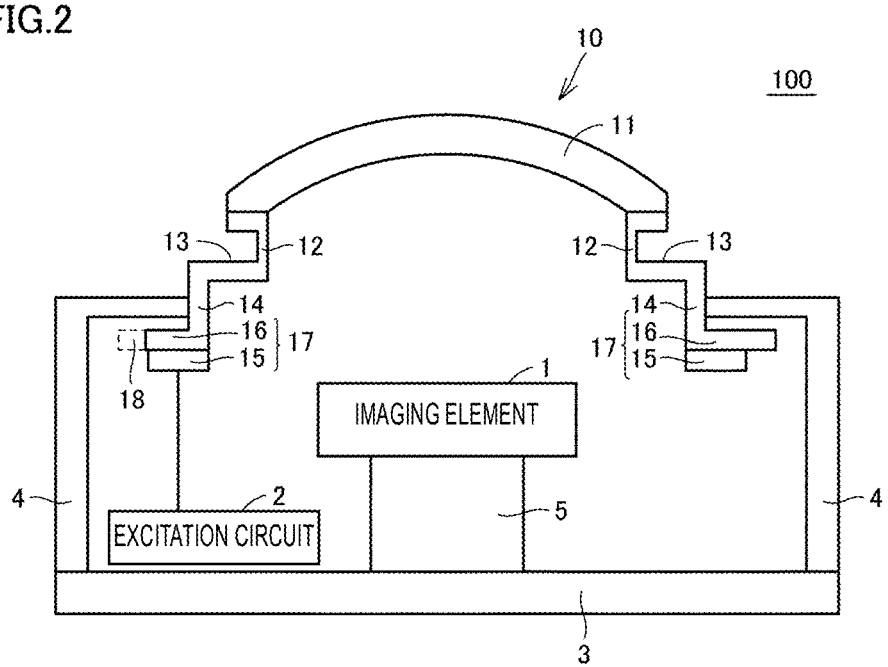
FIG. 2 is a schematic diagram for explaining a configuration of an imaging unit according to Preferred Embodiment 1 of the present invention.

FIG. 2 is a schematic diagram for explaining a configuration of an imaging unit 100 according to Preferred Embodiment 1. FIG. 2 is a sectional view of the vibration device 10 in which the vibration device 10 of FIG. 1 is cut at the center in the axial direction (the vertical direction in the figure) of the second cylindrical body 14 with respect to the protective cover 11. The imaging unit 100 is attached, for example, on a front side, a rear side, or the like of a vehicle, and images an object to be imaged. Note that a location where the imaging unit 100 is attached is not limited to the vehicle, and may be attached to another device such as a ship, an airplane, or the like, for example.

The imaging unit 100 includes the vibration device 10 and a camera 1 as an imaging element housed in the vibration device 10. The camera 1 is fixed to an upper end portion of a main body member 5 fixed to a base member 3. The vibration device 10 is supported by a support member 4 fixed to the base member 3.

In a case where the imaging unit 100 is attached to a vehicle or the like and is used outdoors, foreign matter, such as raindrops, mud, dust, and the like, for example, may adhere to the protective cover 11 that is provided in a visual field of the camera 1 and covers an exterior thereof. The vibration device 10 can generate a vibration to remove foreign matter, such as raindrops or the like, for example, adhering to the protective cover 11.

The vibration device 10 includes an excitation circuit that applies a drive signal to generate a vibration to the piezoelectric element 15. The excitation circuit 2 is connected to the piezoelectric element 15. The piezoelectric element 15 vibrates in the axial direction of the second cylindrical body 14 based on the drive signal from the excitation circuit 2. The vibration of the piezoelectric element 15 causes the vibrating plate 16 to vibrate in the axial direction of the second cylindrical body 14, and the vibrating plate 16 causes the second cylindrical body 14 to vibrate in the axial direction of the second cylindrical body 14. The vibration of the second cylindrical body 14 makes it possible to transmit the vibration of the piezoelectric element 15 to the first cylindrical body 12 via the plate spring 13. In the vibration device 10, the first cylindrical body 12 is vibrated to cause the protective cover 11 to vibrate, such that foreign matter, such as raindrops or the like, for example, adhering to the protective cover 11 is removed.

The excitation circuit 2 applies a drive signal to the piezoelectric element 15 so that the first cylindrical body 12 and the second cylindrical body 14 vibrate in opposite phase to each other in the axial direction of the second cylindrical body 14. The excitation circuit 2 can vibrate the vibration device 10 in a vibration mode other than the first cylindrical body 12 and the second cylindrical body 14 vibrating in opposite phase to each other in the axial direction of the second cylindrical body 14 by the drive signal applied to the piezoelectric element 15.

As illustrated in FIG. 2, a thickness of the first cylindrical body 12 is thinner than a thickness of the plate spring 13 and the second cylindrical body 14. The thickness of the first cylindrical body 12 is shorter than a length from a position of the plate spring 13 supporting the first cylindrical body 12 to a position of the plate spring 13 supported by the second cylindrical body 14.

Figure 3A:
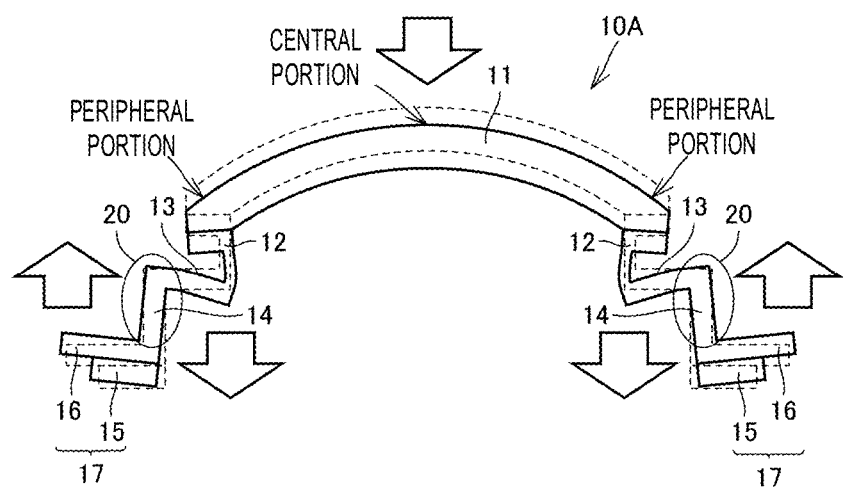
FIGS. 3A and 3B include diagrams for explaining vibration of a vibration device in which a cutout portion is not provided according to Preferred Embodiment 1 of the present invention, and vibration of a vibration device for comparison.
Figure 3B:
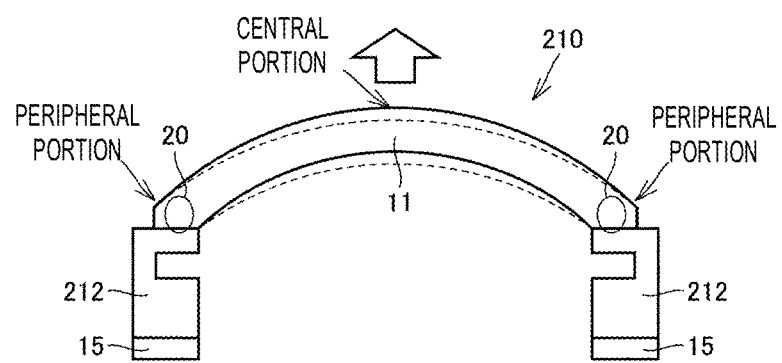

Before describing the vibration in the non-equilibrium state of the vibration device 10 in which the cutout portion 18 is provided in a portion of the vibrating body 17, the vibration in an equilibrium state of a vibration device 10A in which the cutout portion 18 is not provided in a portion of the vibrating body 17 will be described. FIGS. 3A and 3B are diagrams for explaining the vibration of the vibration device 10A in which the cutout portion 18 is not provided according to Preferred Embodiment 1 and vibration of a vibration device 210 for comparison. FIG. 3A illustrates a vibration example of the vibration device 10A in which the cutout portion 18 is not provided according to Preferred Embodiment 1, and FIG. 3B illustrates a vibration example of the vibration device 210 for comparison. In the vibration device 10A in which the cutout portion 18 is not provided according to Preferred Embodiment 1, the first cylindrical body 12 is displaced vertically in a uniform or substantially uniform manner by the vibration of the piezoelectric element 15, such that the entirety of the protective cover 11 vibrates uniformly or substantially uniformly in the vertical direction. On the other hand, in the vibration device 210 for comparison, the protective cover 11 is vibrated so as to be most largely displaced in the vertical direction in the central portion and not to be displaced in a peripheral portion by the vibration of the piezoelectric element 15. In FIGS. 3A and 3B, reference positions of the vibration devices 10A and 210 before the start of the vibration are indicated by broken lines, and positions of the vibration devices 10A and 210 after the displacement are indicated by solid lines.

Referring to FIG. 3A, since the piezoelectric element 15 vibrates in the axial direction of the second cylindrical body 14 based on a signal from the excitation circuit 2 (see FIG. 2), when the vibrating plate 16 is displaced upward, the second cylindrical body 14 is also displaced upward, and the position of the plate spring 13 supporting the first cylindrical body 12 sinks downward. Due to the position of the plate spring 13 that supports the first cylindrical body 12 sinking downward, the entirety of the first cylindrical body 12 is displaced downward, and as a result, the entirety of the protective cover 11 held by the first cylindrical body 12 is also displaced downward. At this time, a node (a portion which is not displaced even by the vibration of the piezoelectric element 15) 20 is provided on a side surface of the second cylindrical body 14.

Although not illustrated, since the piezoelectric element 15 vibrates in the axial direction of the second cylindrical body 14 based on the drive signal from the excitation circuit 2 (see FIG. 2), when the vibrating plate 16 is displaced downward, the second cylindrical body 14 is also displaced downward, and the position of the plate spring 13 supporting the first cylindrical body 12 rises upward. Due to the position of the plate spring 13 that supports the first cylindrical body 12 rising upward, the entirety of the first cylindrical body 12 is displaced upward, and as a result, the entirety of the protective cover 11 held by the first cylindrical body 12 is also displaced upward. At this time, the node 20 is provided on the side surface of the second cylindrical body 14. As such, in the vibration device 10 illustrated in FIG. 2, the side surface of the second cylindrical body 14 on which the node 20 is provided is supported by the support member 4, so that the vibration of the piezoelectric element 15 is not transmitted to the support member 4, and the vibration of the piezoelectric element 15 can be efficiently transmitted to the first cylindrical body 12 and the protective cover 11.

As illustrated in FIG. 3A, in the vibration device 10A in which the cutout portion 18 is not provided according to Preferred Embodiment 1, the entirety of the protective cover 11 is uniformly or substantially uniformly displaced in the vertical direction without the protective cover 11 itself substantially deforming by the vibration of the piezoelectric element 15.

On the other hand, the vibration device 210 for comparison illustrated in FIG. 3B cannot vibrate the entirety of the protective cover 11 so as to be uniformly or substantially uniformly displaced in the vertical direction because of its structure, but can vibrate in the central portion of the protective cover 11 so as to be most largely displaced in the vertical direction. Specifically, referring to FIG. 3B, the vibration device 210 for comparison includes the protective cover 11, a first cylindrical body 212, and the piezoelectric element 15. The protective cover 11 is held at an end portion of the cylindrical first cylindrical body 212. The first cylindrical body 212 includes a partially recessed portion provided on an inner surface close to an end portion on which the piezoelectric element 15. The piezoelectric element 15 vibrates in the axial direction of the first cylindrical body 212 based on the drive signal from the excitation circuit 2 (see FIG. 2), such that the vibration is transmitted to the protective cover 11 via the first cylindrical body 212, and the protective cover 11 vibrates so as to be most largely displaced in an upward direction in the central portion thereof. At this time, the node 20 is provided in the peripheral portion of the protective cover 11. As illustrated in FIG. 3B, in the vibration device 210 for comparison, the protective cover 11 vibrates so as to be most largely displaced in the vertical direction in the central portion and not to be displaced in the peripheral portion by the vibration of the piezoelectric element 15.

A difference in vibration between the vibration device 10A in which the cutout portion 18 is not provided according to Preferred Embodiment 1 and the vibration device 210 for comparison is due to a difference in structure between the vibration device 10A and the vibration device 210. However, also in the vibration device 10A according to Preferred Embodiment 1, when the frequency for excitation is increased, the protective cover 11 vibrates so as to be most largely displaced in the vertical direction in the central portion and not to be displaced in the peripheral portion, because of its structure, as in the case of the vibration device 210 for comparison. That is, the vibration device 10 is capable of being vibrated in a plurality of different vibration modes depending on the frequency for excitation. Here, the frequency at which the vibration device 10 is excited can be adjusted by changing the frequency of the drive signal to be applied to the piezoelectric element 15. Hereinafter, as in the vibration device 210 for comparison, that is, the protective cover 11 vibrates so as to be most largely displaced in the vertical direction in the central portion and not to be displaced in the peripheral portion, which will be referred to as a protective cover vibration, and such a vibration mode will be referred to as a protective cover vibration mode. On the contrary, in the vibration device 10A according to Preferred Embodiment 1, the entirety of the protective cover 11 uniformly or substantially uniformly vibrates in the vertical direction, which will be referred to as a piston vibration (plate spring vibration), and such a vibration mode is referred to as a piston vibration mode.

Figure 4:
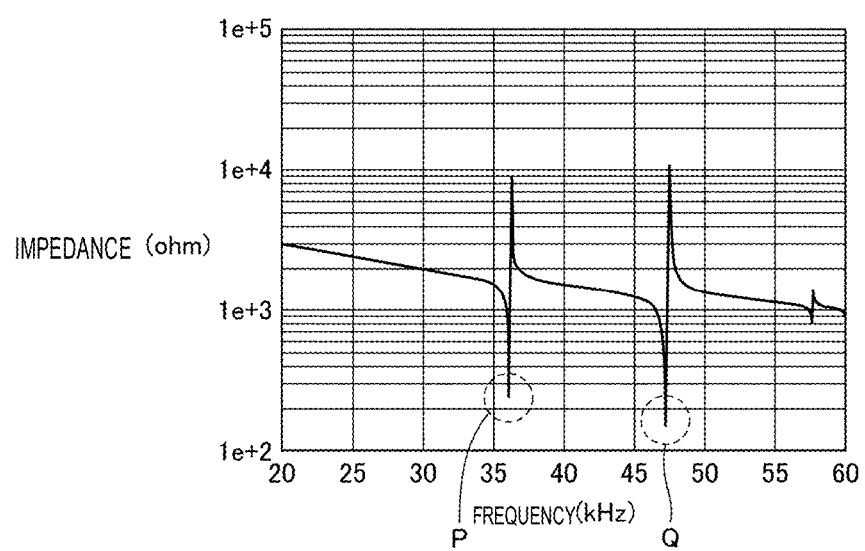
FIG. 4 is a diagram illustrating a relationship between a frequency and an impedance of a drive signal to be applied to a piezoelectric element in the vibration device in which the cutout portion is not provided according to Preferred Embodiment 1 of the present invention.

FIG. 4 is a diagram illustrating a relationship between the frequency and the impedance of the drive signal to be applied to the piezoelectric element 15 in the vibration device 10A in which the cutout portion 18 is not provided according to Preferred Embodiment 1. As can be seen from a portion indicated by a position P in FIG. 4, the impedance of the piezoelectric element 15 largely changes around about 36 kHz. The position P indicates the frequency of the drive signal in a case where the protective cover vibrates in the piston vibration mode. Hereinafter, the frequency of the drive signal in the case where the protective cover 11 vibrates in the piston vibration mode will be referred to as a "resonant frequency of the piston vibration mode". As can be seen from a portion indicated by a position Q in FIG. 4, the impedance of the piezoelectric element 15 largely changes around about 47 kHz greater than the frequency at the position P. The position Q indicates the frequency of the drive signal in a case where the protective cover 11 vibrates in the protective cover vibration mode. Hereinafter, the frequency of the drive signal in a case where the protective cover 11 vibrates in the protective cover vibration mode will be referred to as a "resonant frequency of the protective cover vibration mode".

As illustrated in FIG. 4, in the vibration device 10A, the vibration mode is changed depending on the frequency of the drive signal to be applied to the piezoelectric element 15. The resonant frequency of the piston vibration mode is about 36 kHz, whereas the resonant frequency of the protective cover vibration mode is large, which is about 47 kHz. Assuming that the resonant frequency of the piston vibration mode and the resonant frequency of the protective cover vibration mode are close to each other, the vibration device 10A cannot vibrate the protective cover 11 only in the piston vibration mode. Here, the relationship between the resonant frequency of the piston vibration mode and the resonant frequency of the protective cover vibration mode varies depending on the structure of the vibration device 10A. In particular, the relationship between the resonant frequency of the piston vibration mode and the resonant frequency of the protective cover vibration mode varies greatly depending on the thickness of the protective cover 11.

Figure 5:
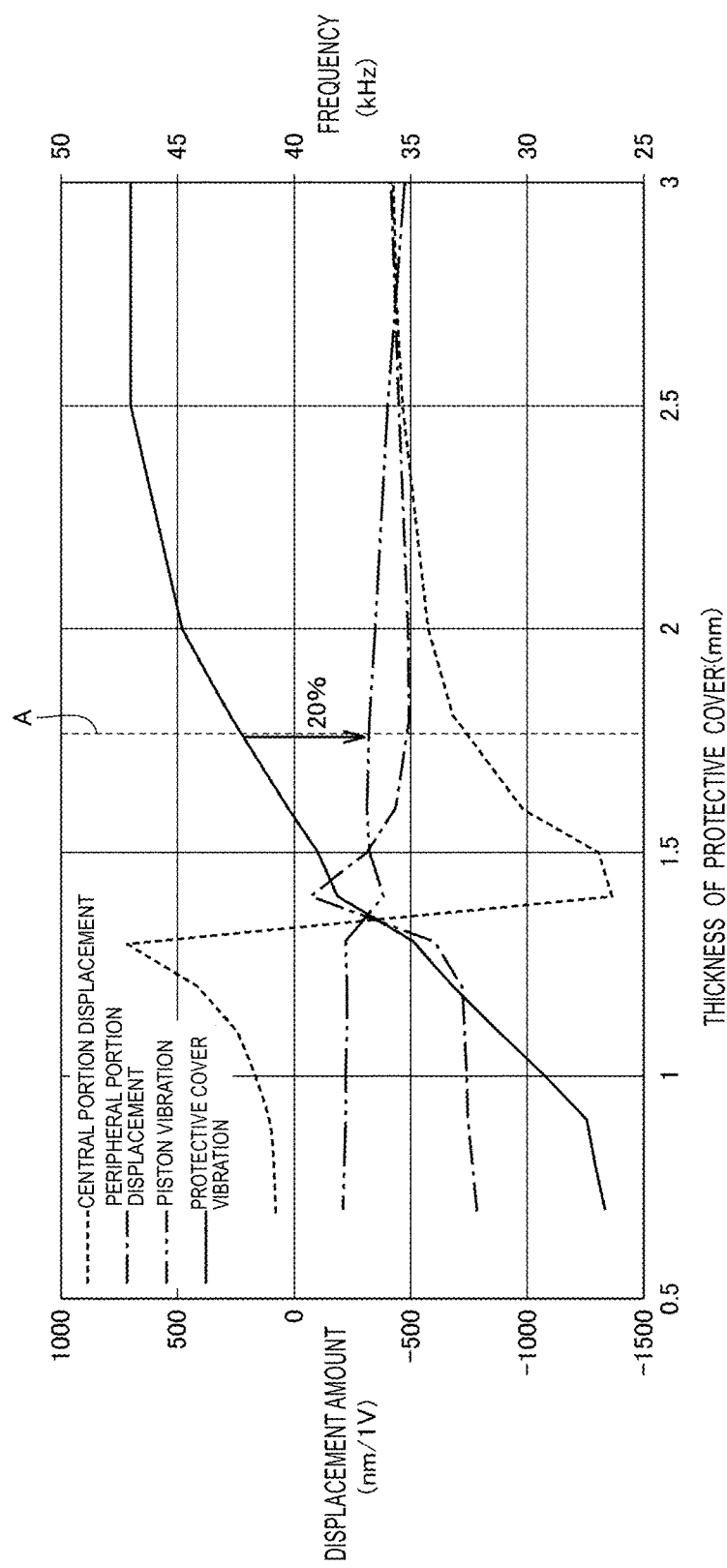
FIG. 5 is a graph showing a relationship between a resonant frequency of a piston vibration mode and a resonant frequency of a protective cover vibration mode depending on a change in thickness of the protective cover according to Preferred Embodiment 1 of the present invention.

FIG. 5 is a graph showing a relationship between the resonant frequency of the piston vibration mode and the resonant frequency of the protective cover vibration mode due to the change in the thickness of the protective cover 11 according to Preferred Embodiment 1. In FIG. 5, the resonant frequency of the plate spring vibration by the piston vibration mode at the position P in FIG. 4 and the resonant frequency of the protective cover vibration by the protective cover vibration mode at the position Q are plotted. FIG. 5 shows a change in displacement of the central portion and a change in displacement of the peripheral portion of the protective cover 11 in a case where the thickness of the protective cover 11 is changed regarding the shape thereof as a flat plate not as a dome shape and the vibration device 10A is vibrated at the resonant frequency of the piston vibration mode. As can be seen from FIG. 5, the resonant frequency of the piston vibration mode gradually decreases as the thickness of the protective cover 11 increases. On the other hand, the resonant frequency of the protective cover vibration mode increases as the thickness of the protective cover 11 increases.

When the thickness of the protective cover 11 is about 1.35 mm, the resonant frequency of the protective cover vibration mode is the same or substantially the same as the resonant frequency of the piston vibration mode. That is, the vibration device 10A cannot perform driving by separating the protective cover vibration mode and the piston vibration mode when the protective cover 11 has the thickness of about 1.35 mm. Before and after the point at which the resonant frequencies are approximately the same, the displacement of the central portion of the protective cover 11, which increases along with the thickness of the protective cover 11, sharply decreases. Further, before and after this point, the displacement of the peripheral portion of the protective cover 11, which gradually increases along with the thickness of the protective cover 11, sharply increases. In a region where the thickness of the protective cover 11 is thicker than about 1.35 mm, the resonant frequency of the protective cover vibration mode has a value larger than the resonant frequency of the piston vibration mode. Note that, in the above-described example, the thickness of the protective cover 11 is changed to make the resonant frequency of the protective cover vibration mode be larger than the resonant frequency of the piston vibration mode. However, the structure of the protective cover 11, the first cylindrical body 12, the plate spring 13, or the second cylindrical body 14 may be configured such that the resonant frequency of the protective cover vibration mode is larger than the resonant frequency of the piston vibration mode.

As can be seen from FIG. 5, in a region where the resonant frequency of the protective cover vibration mode is higher than the resonant frequency of the piston vibration mode, the displacement of the central portion and the displacement of the peripheral portion of the protective cover 11 converge to the same or substantially the same displacement, and the entirety of the protective cover 11 is displaced. That is, in the region, the vibration device 10A can vibrate the protective cover 11 in the piston vibration mode as illustrated in FIG. 3A. In particular, in a region on the right side of a broken line A in FIG. 5, the displacement of the central portion and the displacement of the peripheral portion of the protective cover 11 per unit voltage converge around −500 (nm/1V). The thickness of the protective cover 11 on the broken line A is about 1.75 mm. Further, the resonant frequency of the protective cover vibration mode on the broken line A is about 1.2 times the resonant frequency of the piston vibration mode. In a case where the resonant frequency of the protective cover vibration mode is equal to or more than about 1.2 times the resonant frequency of the piston vibration mode, the vibration device 10A can vibrate the protective cover 11 in the piston vibration mode. In the region on the right side of the broken line A, since the resonant frequency of the protective cover vibration mode is equal to or more than about 1.2 times the resonant frequency of the piston vibration mode, the vibration device 10A makes it easy to vibrate the protective cover 11 in the piston vibration mode. Note that, in the above-described example, the thickness of the protective cover 11 is changed to make the resonant frequency of the protective cover vibration mode be about 1.2 times the resonant frequency of the piston vibration mode. However, the structure of the protective cover 11, the first cylindrical body 12, the plate spring 13, or the second cylindrical body 14 may be configured such that the resonant frequency of the protective cover vibration mode is about 1.2 times the resonant frequency of the piston vibration mode.

As illustrated in FIG. 5, when the thickness of the protective cover 11 is equal to or more than about 2.5 mm, the displacement of the central portion and the displacement of the peripheral portion of the protective cover 11 have the same or substantially the same displacement difference. At this time, the resonant frequency of the protective cover vibration mode is about 1.3 times the resonant frequency of the piston vibration mode.

Figure 6:
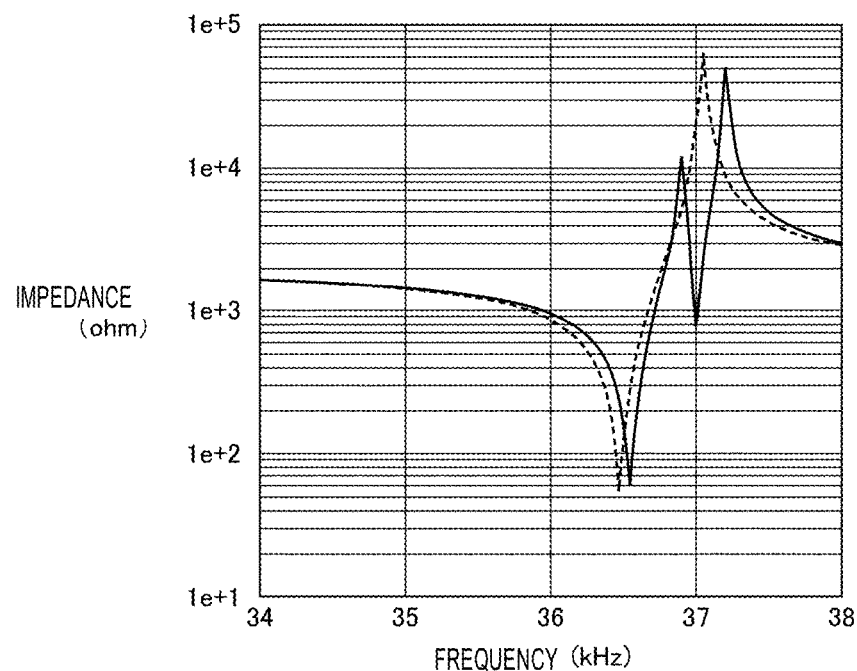
FIG. 6 is a diagram illustrating a relationship between a frequency and an impedance of a drive signal to be applied to the piezoelectric element in the vibration device provided with the cutout portion according to Preferred Embodiment 1 of the present invention.

Next, vibration of the vibration device 10 including the cutout portion 18 according to Preferred Embodiment 1 will be described. Since the vibration device 10 includes the cutout portion 18 in a portion of the vibrating body 17, even when being vibrated in the piston vibration mode as in the case of the vibration device 10A, a difference occurs in a resonant frequency between a side where the cutout portion 18 is provided and a side where the cutout portion 18 is not provided. FIG. 6 is a diagram illustrating a relationship between the frequency and the impedance of the drive signal to be applied to the piezoelectric element in the vibration device 10 including the cutout portion 18 according to Preferred Embodiment 1. In FIG. 6, a vertical axis represents the impedance, a horizontal axis represents the frequency, a graph of the vibration device 10 provided with the cutout portion 18 is indicated by a solid line, and a graph of the vibration device 10A in which the cutout portion 18 is not provided is indicated by a dashed line. As can be seen from FIG. 6, the resonant frequency of the vibration device 10A in which the cutout portion 18 is not provided is unimodal (about 37.1 kHz), and the resonant frequency of the vibration device 10 provided with the cutout portion 18 is split into two (about 36.8 kHz and about 37.3 kHz).

Figure 7:
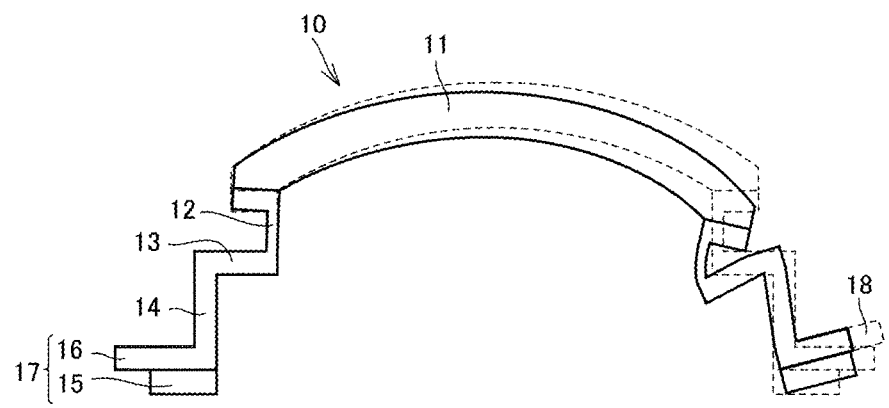
FIG. 7 is a diagram for explaining vibration of the vibration device provided with the cutout portion according to Preferred Embodiment 1 of the present invention.
Figure 8:
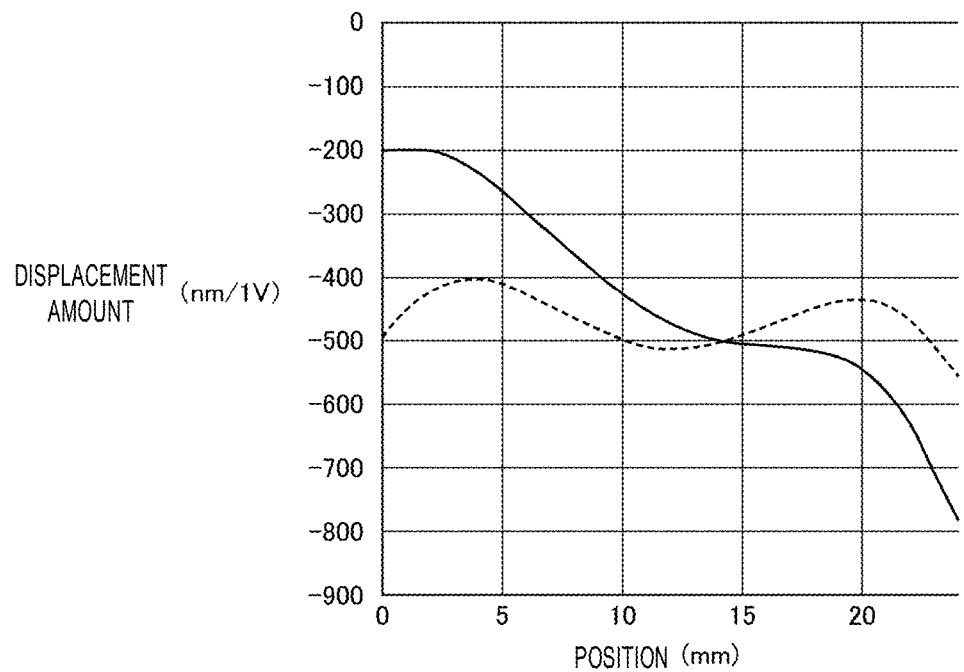
FIG. 8 is a graph showing a relationship between a position and an amount of displacement in the protective cover in the vibration device according to Preferred Embodiment 1 of the present invention.

Therefore, when being vibrated in the piston vibration mode, the vibration device 10 including the cutout portion 18 is displaced in the non-equilibrium state in which the protective cover 11 vibrates in the vertical direction to be inclined, instead of a displacement in the equilibrium state in which the entirety of the protective cover 11 uniformly or substantially uniformly vibrates in the vertical direction. FIG. 7 is a diagram for explaining vibration of the vibration device including the cutout portion according to Preferred Embodiment 1. FIG. 8 is a graph illustrating a relationship between a position and an amount of displacement in the protective cover in the vibration device according to Preferred Embodiment 1.

As illustrated in FIG. 7, the piezoelectric element 15 provided on a bottom surface of the vibration device 10 is vibrated in the upward direction. In the vibration device 10, when the piezoelectric element 15 is vibrated upward, the second cylindrical body 14 is displaced upward, and the position of the plate spring 13 supporting the first cylindrical body 12 sinks downward. At this time, since the plate spring 13 on the side where the cutout portion 18 is provided is displaced more than the plate spring 13 on the side where the cutout portion 18 is not provided, the plate spring 13 on the side where the cutout portion is provided sinks more downward. As a result, the first cylindrical body 12 sinks to be inclined to the side where the cutout portion 18 is provided. The protective cover 11 is in the non-equilibrium state in which the entirety is displaced downward in the rightward direction from the equilibrium state in which the entirety is uniformly or substantially uniformly displaced due to the displacement difference of the first cylindrical body 12.

In FIG. 8, the vertical axis represents the amount of displacement, the horizontal axis represents the position in the protective cover 11, a graph of the vibration device 10 including the cutout portion 18 is indicated by a solid line, and a graph of the vibration device 10A without the cutout portion 18 is indicated by a broken line. The position of 0.0 mm shown in FIG. 8 is a position of a left end of the protective cover 11 in FIG. 7. FIG. 8 illustrates the amount of displacement of the protective cover 11 in a state where the piezoelectric element 15 is vibrated in the upward direction.

As illustrated in FIG. 8, in the vibration device 10A in which the cutout portion 18 is not provided, an absolute value of the amount of displacement of the center or substantially the center of the protective cover 11 is slightly larger than that of the amounts of displacement of the left and right ends, but the protective cover 11 is uniformly or substantially uniformly displaced downward. On the other hand, in the vibration device 10 including the cutout portion 18, an absolute value of the amount of displacement on the side (position of 0.0 mm) where the cutout portion 18 is provided is smaller than an absolute value of the amount of displacement on the side (position of about 23.0 mm) where the cutout portion 18 is not provided. In the vibration device 10 including the cutout portion 18, the absolute value of the amount of displacement increases toward the right end of the protective cover 11 and exceeds the absolute value of the amount of displacement of the vibration device 10A in which the cutout portion 18 is not provided from around a position exceeding about 13.0 mm.

As described above, the vibration device 10 according to Preferred Embodiment 1 includes the protective cover 11, the first cylindrical body 12, the plate spring 13, the second cylindrical body 14, the piezoelectric element 15, and the vibrating plate 16. The vibration device 10 further includes the cutout portion 18 (non-equilibrium element) that removes a portion of mass with respect to at least one of the protective cover 11, the first cylindrical body 12, the plate spring 13, the second cylindrical body 14, and vibrating plate 16. As a result, since the vibration device 10 vibrates in the vertical direction while the protective cover 11 is inclined to one side without the protective cover 11 itself substantially deforming, the foreign matter (for example, raindrops or the like) adhering to the protective cover 11 moves in a direction in which the protective cover 11 is inclined and is atomized. The vibration device 10 is capable of moving the foreign matter adhering to the protective cover 11 in the direction in which the protective cover 11 is inclined and atomizing the foreign matter, so that the foreign matter can be removed without obstructing the field of view of the protective cover 11, as compared with a case where the foreign matter is collected at one location in the protective cover 11 and then atomized.

Further, when the direction in which the protective cover 11 is inclined is the same as the direction of gravity, the vibration device 10 moves the foreign matter on the protective cover 11 more easily and can discharge the foreign matter from the peripheral portion of the protective cover 11 without atomizing the foreign matter. Specifically, as illustrated in FIG. 7, the vibration device 10 preferably adjusts the direction in which the amount of displacement (absolute value) increases to the direction of gravity, and has a constant or substantially constant amplitude from the central portion to the right side in FIG. 7, such that even if the movement speed decreases, the foreign matter can be discharged from the peripheral portion of the protective cover 11 due to gravity.

Further, in the vibration device 10, the protective cover 11, the first cylindrical body 12, the plate spring 13, and the second cylindrical body 14 are configured such that the resonant frequency in the protective cover vibration mode is larger than the resonant frequency in the piston vibration mode, and the excitation circuit 2 that drives the piezoelectric element 15 is further included. In a resonance system in which the resonant frequency of the protective cover 11 (the resonant frequency of the protective cover vibration mode) is equal to or more than about 1.2 times the resonant frequency of the plate spring 13 (the resonant frequency of the piston vibration mode), the excitation circuit 2 can selectively excite the resonance (the protective cover vibration) of the protective cover 11 and the resonance (the piston vibration) of the plate spring 13. That is, in the vibration device 10, it is possible to selectively switch the vibration mode between the protective cover vibration mode and the piston vibration mode. Accordingly, when the vibration device 10 uses the protective cover vibration mode, the foreign matter adhering to the protective cover 11 can be collected and atomized at the center or approximate center of the protective cover 11, and when the piston vibration mode is used, the foreign matter adhering to the protective cover 11 including that on the peripheral portion can be atomized there at one time. That is, in the vibration device 10, it is possible to remove the foreign matter adhering to the protective cover 11 while maintaining the field of view of the protective cover 11 by selectively using the vibration mode.

Further, the thickness of the first cylindrical body 12 is shorter than a length from a position of the plate spring 13 supporting the first cylindrical body 12 to a position of the plate spring 13 supported by the second cylindrical body 14. Accordingly, the vibration device 10 can remove the foreign matter adhering to the protective cover 11 while maintaining the field of view of the protective cover 11.

Figure 9:
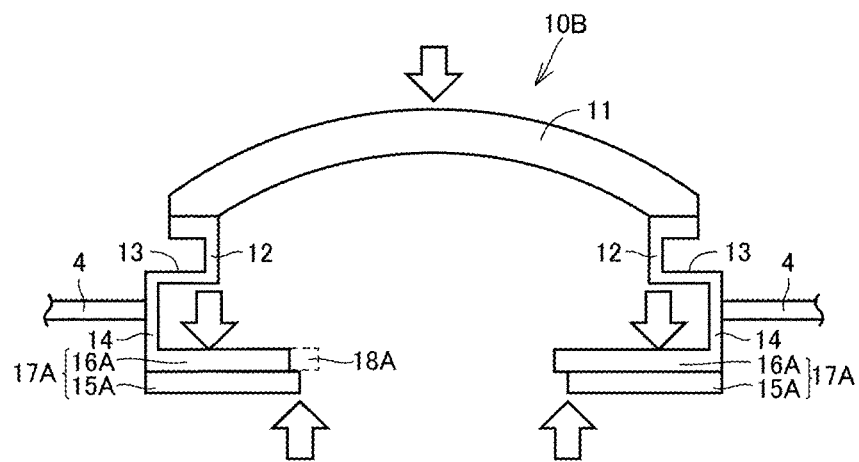
FIG. 9 is a sectional view of a vibration device according to a modified example of Preferred Embodiment 1 of the present invention.

Referring to FIG. 9, a modified example of Preferred Embodiment 1 will be described. Note that the same or corresponding components as those in Preferred Embodiment 1 are denoted by the same reference numerals, and the description thereof will not be repeated. FIG. 9 is a sectional view of a vibration device 10B according to the modified example of Preferred Embodiment 1. The vibration device 10B differs from the vibration device 10 in that a vibrating body 17A extends toward an inside of the vibration device 10B.

The vibrating body 17A is provided in the other end of the second cylindrical body 14 (the second cylindrical body 14 supports the plate spring 13 at one end), and vibrates in the axial direction of the second cylindrical body 14 (in the vertical direction in the figure). The vibrating body 17A includes a piezoelectric element 15A and a vibrating plate 16A. The piezoelectric element 15A has a hollow circular or substantially circular shape, and is provided on a lower surface of the vibrating plate 16A. The vibrating plate 16A supports the bottom surface of the second cylindrical body 14, and extends inward from the supported position. The vibrating plate 16A has a hollow circular or substantially circular shape, and is provided inside the second cylindrical body 14. Due to the piezoelectric element 15A vibrating in the axial direction of the second cylindrical body 14, the vibrating plate 16A vibrates in the axial direction of the second cylindrical body 14.

A cutout portion 18A is provided in a portion of the vibrating body 17A. The cutout portion 18A is formed by cutting out a portion of the vibrating body 17A, and is formed by cutting out a portion of the vibrating body 17A on the left side in the figure.

The vibration device 10B can vibrate the protective cover 11 with inclination to one side in the piston vibration mode in the same or substantially the same manner as the vibration device 10, so that the same advantageous effects as those of the vibration device 10 can be obtained. Note that, in the vibration device 10B, a plurality of rectangular or substantially rectangular piezoelectric elements 15A may be concentrically provided on the lower surface of the vibrating plate 16A. In addition, the hollow circular or substantially circular piezoelectric element 15A may be provided on an upper surface of the vibrating plate 16A. Further, the plurality of rectangular or substantially rectangular piezoelectric elements 15A may be concentrically provided on the upper surface of the vibrating plate 16A. Further, the piezoelectric element 15A may have a shape corresponding to the shape of the vibrating plate 16A, and the piezoelectric element 15A and the vibrating plate 16A may be integrally provided.

Preferred Embodiment 2

Referring to FIG. 10 to FIG. 13, Preferred Embodiment 2 of the present invention will be described. Note that the same or corresponding components as those in Preferred Embodiment 1 are denoted by the same reference numerals, and the description thereof will not be repeated. In the vibration device 10 according to Preferred Embodiment 1, the cutout portion 18 is provided in a portion of the vibrating body 17. In contrast, in a vibration device according to Preferred Embodiment 2, a weight is provided on a portion of the plate spring, instead of the cutout portion. The weight is one of the non-equilibrium element to vibrate the protective cover in the non-equilibrium state of the vibration device.

Figure 10:
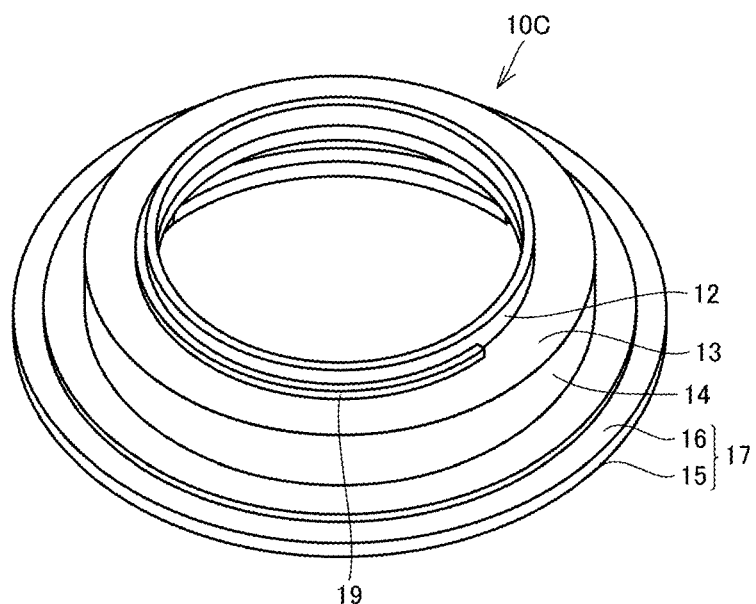
FIG. 10 is a perspective view of a vibration device according to Preferred Embodiment 2 of the present invention.

FIG. 10 is a perspective view of a vibration device 10C according to Preferred Embodiment 2. The vibration device 10C includes the protective cover 11, the first cylindrical body 12, the plate spring 13, the second cylindrical body 14, the vibrating body 17, and a weight 19. In FIG. 10, the protective cover 11 held at the end portion of the first cylindrical body 12 is not illustrated so that a position at which the weight 19 is provided can be seen. However, similar to the vibration device 10 illustrated in FIG. 1, the vibration device 10C includes the protective cover 11.

The weight 19 is provided on a portion of a boundary between the first cylindrical body 12 and the plate spring 13, and is provided on a portion of the first cylindrical body 12, instead of being provided on the entire circumference thereof. A material of the weight 19 is not limited as long as a mass can be added to a portion of the plate spring 13, and the weight may be made of the same material as or a different material from that of the first cylindrical body 12 or the like.

Figure 11:
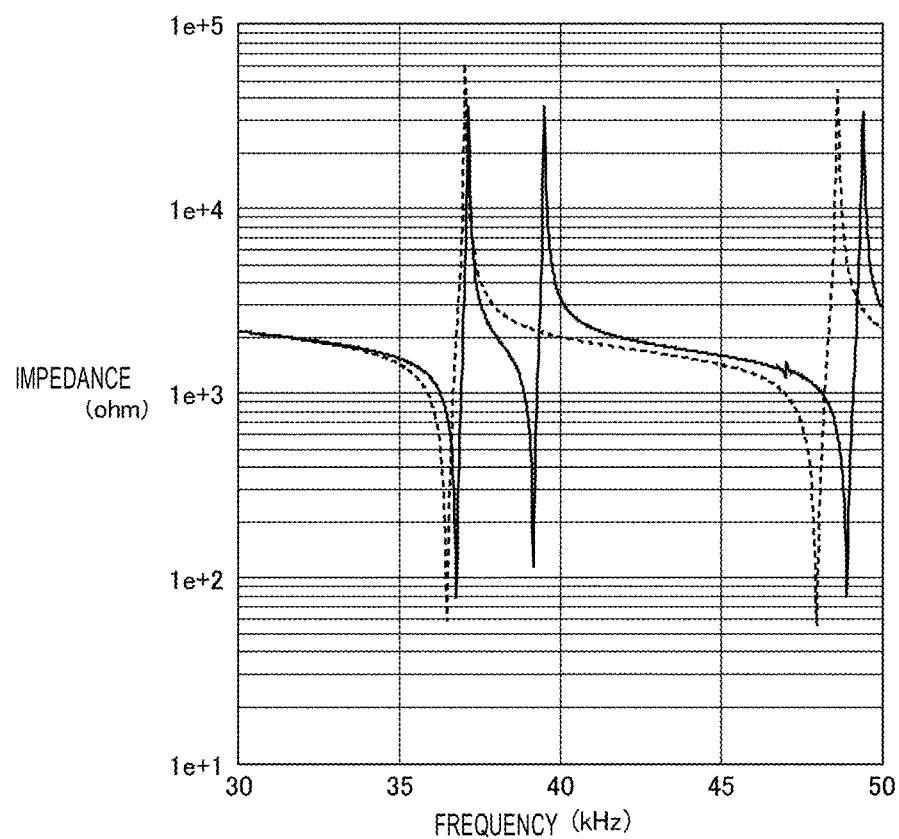
FIG. 11 is a diagram illustrating a relationship between a frequency and an impedance of a drive signal to be applied to the piezoelectric element in the vibration device provided with a weight according to Preferred Embodiment 2 of the present invention.

Next, the vibration of the vibration device 10C provided with the weight 19 according to Preferred Embodiment 2 will be described. The vibration device 10C includes the weight 19 in a portion of the vibrating body 17, so that even when being vibrated in the piston vibration mode, a difference occurs in the resonant frequency between the side where the weight 19 is provided and the side where the weight 19 is not provided. FIG. 11 is a diagram illustrating a relationship between the frequency and the impedance of the drive signal to be applied to the piezoelectric element in the vibration device 10C including the weight 19 according to Preferred Embodiment 2. In FIG. 11, the vertical axis represents the impedance, the horizontal axis represents the frequency, a graph of the vibration device 10C including the weight 19 is indicated by a solid line, and a graph of the vibration device in which the weight 19 is not provided for comparison is indicated by a dashed line. As can be seen from FIG. 11, the resonant frequency of the vibration device in which the weight 19 is not provided is a unimodal (about 37 kHz), and the resonant frequency of the vibration device 10C provided with the weight 19 is split into two (about 37 kHz and about 39.5 kHz).

Figure 12:
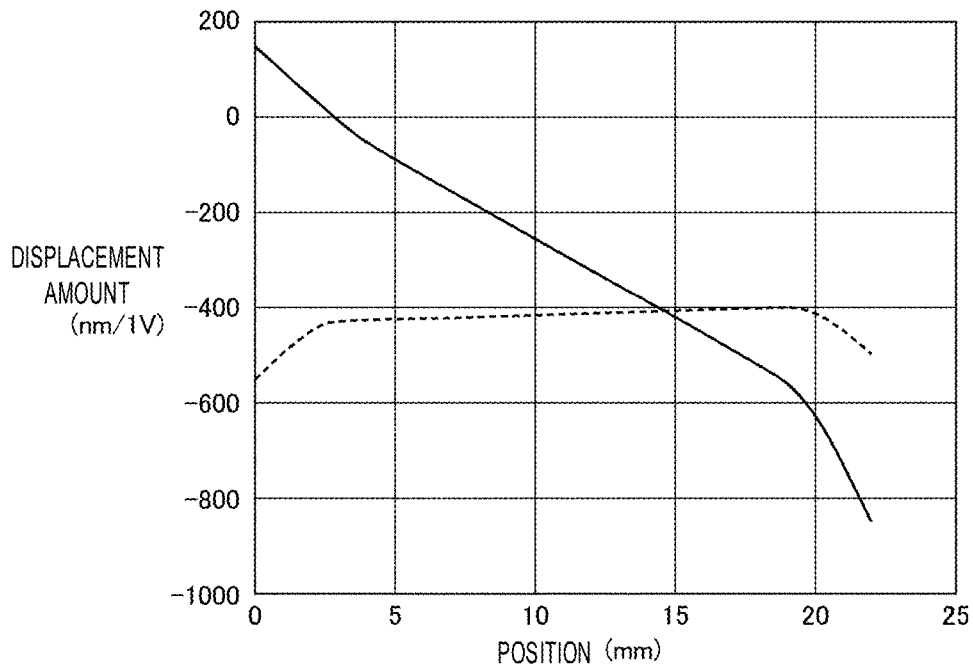
FIG. 12 is a graph showing a relationship between a position and an amount of displacement in the protective cover in the vibration device according to Preferred Embodiment 2 of the present invention.

Therefore, when being vibrated in the piston vibration mode, the vibration device 10C including the weight 19 is displaced in the non-equilibrium state in which the protective cover 11 vibrates in the vertical direction to be inclined, instead of a displacement in the equilibrium state in which the entirety of the protective cover 11 uniformly or substantially uniformly vibrates in the vertical direction. FIG. 12 is a graph illustrating a relationship between a position and an amount of displacement in the protective cover in the vibration device 10C according to Preferred Embodiment 2.

The piezoelectric element 15 provided on a bottom surface of the vibration device 10C is vibrated in the upward direction. In the vibration device 10C, the piezoelectric element 15 vibrates in the upward direction, so that the second cylindrical body 14 is displaced in the upward direction, and the position of the plate spring 13 supporting the first cylindrical body 12 sinks downward. At this time, since the plate spring 13 on the side where the weight 19 is provided is displaced more than the plate spring 13 on the side where the weight 19 is not provided, the plate spring 13 on the side where the weight 19 is provided sinks more downward. As a result, the first cylindrical body 12 sinks to be inclined toward the side where the weight 19 is provided. The protective cover 11 is in the non-equilibrium state in which the entire protective cover 11 is displaced to be inclined to the side where the weight 19 is provide from the equilibrium state in which the entirety is uniformly or substantially uniformly displaced due to the displacement difference of the first cylindrical body 12 on the side where the weight 19 is provided and on the side where the weight 19 is not provided.

In FIG. 12, the vertical axis represents the amount of displacement, the horizontal axis represents the position in the protective cover 11, a graph of the vibration device 10C including the weight 19 is indicated by a solid line, and a graph of the vibration device in which the weight 19 is not provided for comparison is indicated by a broken line. The position of 0.0 mm illustrated in FIG. 12 is a position of an end on a side on which the weight 19 is not provided in FIG. 10. FIG. 12 illustrates the amounts of displacement at respective positions of the protective cover 11 (not illustrated in FIG. 10) in a state where the piezoelectric element 15 is vibrated upward.

As illustrated in FIG. 12, in the vibration device in which the weight 19 is not provided, the protective cover 11 is uniformly or substantially uniformly displaced downward. On the other hand, in the vibration device 10C provided with the weight 19, an absolute value of the amount of displacement on the side (position of 0.0 mm) where the weight 19 is provided is smaller than that of the amount of displacement on the side (position of about 22.0 mm) where the weight 19 is not provided. In the vibration device 10C including the weight 19, the absolute value of the amount of displacement increases toward the end on the side where the weight 19 is not provided, and exceeds that of the amount of displacement of the vibration device in which the weight 19 is not provided from around a position exceeding about 15.0 mm. Note that, as for the vibration of the vibration device 10C, it is preferable that a minimum displacement of the protective cover 11 is about half of a maximum displacement rather than a case where the minimum displacement is 0 (zero). When the difference between the minimum displacement and the maximum displacement is too large, it is necessary to perform driving to a large extent including a maximum displacement point for the movement of the foreign matter, such as raindrops, for example, as a result, there is a possibility that the foreign matter, such as raindrops, for example, will become atomized before reaching the periphery. The vibration device 10C has the objective of discharging the foreign matter, such as raindrops, for example, from the peripheral portion by vibrating the protective cover 11 in an inclined manner, so that it is preferable to vibrate the protective cover 11 with an appropriate inclination.

Figure 13:
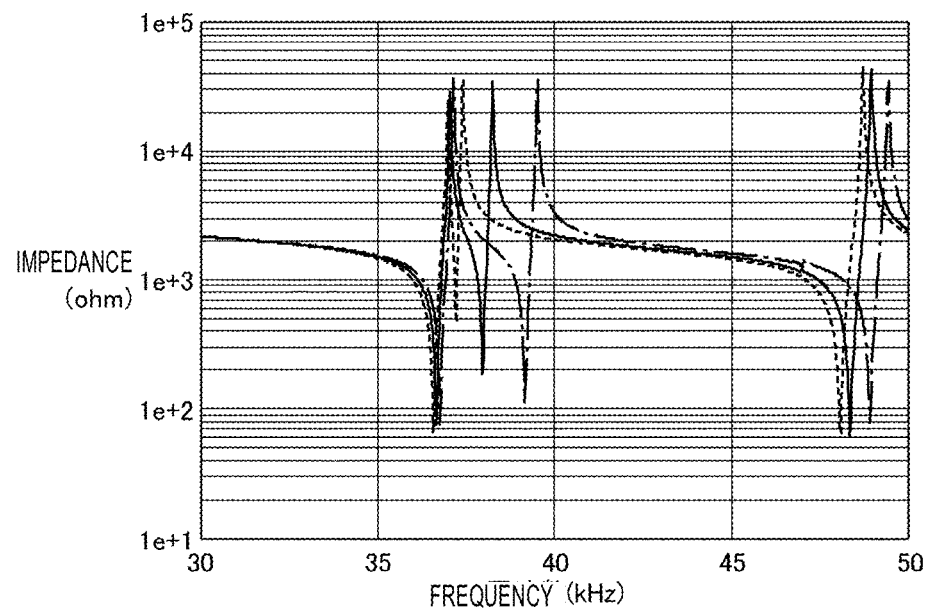
FIG. 13 is a diagram illustrating a change in impedance when the weight of a weight is changed.

The resonant frequency of the piston vibration mode also changes depending on the weight of the weight 19. FIG. 13 is a diagram illustrating a change in impedance in a case where the weight of the weight 19 is changed. In FIG. 13, the vertical axis represents the impedance, the horizontal axis represents the frequency, and vibrations of the vibration devices having different weights of the weight 19 are indicated by lines that are changed in type, respectively. As can be seen from FIG. 13, by increasing the weight of the weight 19, the resonant frequency of the piston vibration mode is changed in a direction in which the resonant frequency of the piston oscillation mode increases. As compared with the vibration device indicated by the solid line, the vibration device indicated by an alternate long and short dash line uses a weight having about two times the weight, and the resonant frequency increases from about 37.5 kHz to about 39 kHz. On the contrary, as compared with the vibration device indicated by the solid line, the vibration device indicated by a broken line uses a weight having about 0.4 times the weight, and the resonant frequency decreases from about 37.5 kHz to about 36 kHz. Note that when the thickness of the weight is increased, the weight of the weight increases proportionally, but the amount of change in the resonant frequency does not necessarily change proportionally. Further, the weight of the weight increases even when the weight is increased in the circumferential direction instead of increasing the weight in the thickness direction. However, this results in a relationship different from a relationship between an increase in the thickness of the weight and a change in amount of the resonant frequency. However, when the weight of the weight is increased, the resonant frequency is split, thus showing the same tendency in which an interval between the resonant frequencies increases, which is an effect that is described as an arrangement effect of the weight.

As described above, the vibration device 10C according to Preferred Embodiment 2 includes the protective cover 11, the first cylindrical body 12, the plate spring 13, the second cylindrical body 14, the piezoelectric element 15, and the vibrating plate 16. The vibration device 10 further includes the weight 19 (non-equilibrium element) that adds a mass of a portion with respect to at least one of the protective cover 11, the first cylindrical body 12, the plate spring 13, the two cylindrical body 14, and the vibrating plate 16. As a result, since the vibration device 10 vibrates the protective cover 11 in the vertical direction to be inclined to one side without the protective cover 11 itself substantially deforming, the foreign matter (for example, raindrops or the like) adhering to the protective cover 11 moves in a direction in which the protective cover 11 is inclined and is atomized. The vibration device 10 is capable of moving the foreign matter adhering to the protective cover 11 in a direction in which the protective cover 11 is inclined and atomizing the foreign matter, so that the foreign matter can be removed without obstructing the field of view of the protective cover 11, as compared with the case where the foreign matter is collected at one place in the protective cover 11 before being atomized.

Further, in the vibration device 10C, when the direction in which the protective cover 11 is inclined is the same as the direction of gravity, the foreign matter on the protective cover 11 is moved more easily and can be discharged from the peripheral portion of the protective cover 11 without being atomized.

Preferred Embodiment 3

Figure 14:
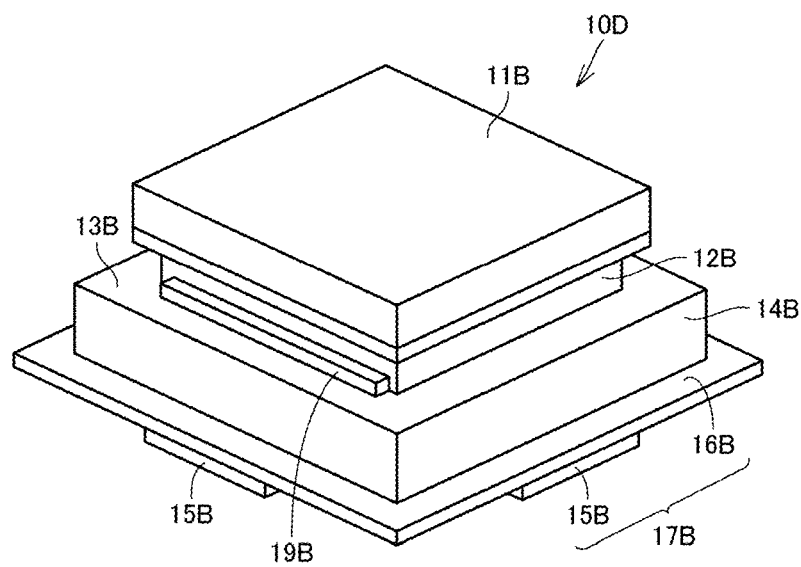
FIG. 14 is a perspective view of a vibration device according to Preferred Embodiment 3 of the present invention.

With reference to FIG. 14, Preferred Embodiment 3 will be described. Note that the same or corresponding components as those in Preferred Embodiment 1 are denoted by the same reference numerals, and the description thereof will not be repeated. The vibration device 10 according to Preferred Embodiment 1 includes a member that has a circular or substantially circular shape when the first cylindrical body 12 is viewed from the axial direction (see FIG. 1). On the other hand, a vibration device according to Preferred Embodiment 3 has a rectangular or substantially rectangular shape when the first cylindrical body is viewed from the axial direction. The vibration device according to Preferred Embodiment 3 is mounted on the imaging unit to be used in the same or substantially the same manner as the vibration device 10 according to Preferred Embodiment 1.

FIG. 14 is a perspective view of a vibration device 10D according to Preferred Embodiment 3. The vibration device 10D differs from the vibration device 10 in that a protective cover 11B, a first cylindrical body 12B, a plate spring 13B, a second cylindrical body 14B, and a vibrating body 17B have a rectangular or substantially rectangular shape when viewed from the axial direction of the first cylindrical body 12B. Further, the vibration device 10D differs from the vibration device 10 in that a plurality of piezoelectric elements 15B is provided along a shape of a vibrating plate 16B.

In the vibration device 10D, the weight 19B is provided on a portion of a boundary between the first cylindrical body 12B and the plate spring 13B. The weight 19B is provided at a portion of the first cylindrical body 12B, instead of being provided on the entire circumference thereof. Of course, as described in Preferred Embodiment 1, the vibration device 10D may include a cutout portion in a portion of the vibrating body 17B instead of the weight 19B.

Even in vibration of the vibration device 10D according to Preferred Embodiment 3, similarly to the vibration of the vibration device 10C according to Preferred Embodiment 2, including the weight 19B the protective cover 11B can be vibrated to be inclined in the piston vibration mode. Therefore, the vibration device 10D according to Preferred Embodiment 3 achieves the same or substantially the same advantageous effects as those of the vibration device 10. In addition, in the vibration device 10D, when the first cylindrical body 12B is viewed from the axial direction, since the protective cover 11B, the first cylindrical body 12B, the plate spring 13B, the second cylindrical body 14B, and the vibrating body 17B have a rectangular or substantially rectangular shape, the member can be used without waste, and further the cutting can be easily performed, so that the manufacturing cost can be reduced.

Note that, in the vibration device 10D, when the first cylindrical body 12B is viewed from the axial direction, it is sufficient that the protective cover 11B, the first cylindrical body 12B, the plate spring 13B, the second cylindrical body 14B, and the vibrating body 17B may have a rectangular or substantially rectangular shape, and may be a square, a rectangle, or a polygon, for example.

Further, in the vibration device 10D, one sheet of piezoelectric elements 15B having a shape corresponding to the shape of the vibrating plate 16B may be provided on a lower surface of the vibrating plate 16B. Further, the piezoelectric element 15B may be provided on an upper surface of the vibrating plate 16B.

As illustrated in the modified example of Preferred Embodiment 1, the vibrating body 17B may extend toward an inside of the vibration device 10D. Specifically, the vibrating plate 16B may extend inward from a position that supports a bottom surface of the second cylindrical body 14B, and the piezoelectric element 15B may be provided on the upper surface or the lower surface of the vibrating plate 16B.

In a case where the first cylindrical body 12 and the like are a cylinder, since the direction in which the protective cover 11 is inclined may be any direction of 360 degrees, there has been a concern that the inclination direction may not be stabilized, but when the first cylindrical body 12B and the like are a horn tube or a square tube as in the case of the vibration device 10D, the inclination direction of the protective cover 11B is stabilized on a side where the weight is provided.

Preferred Embodiment 4

Figure 15:
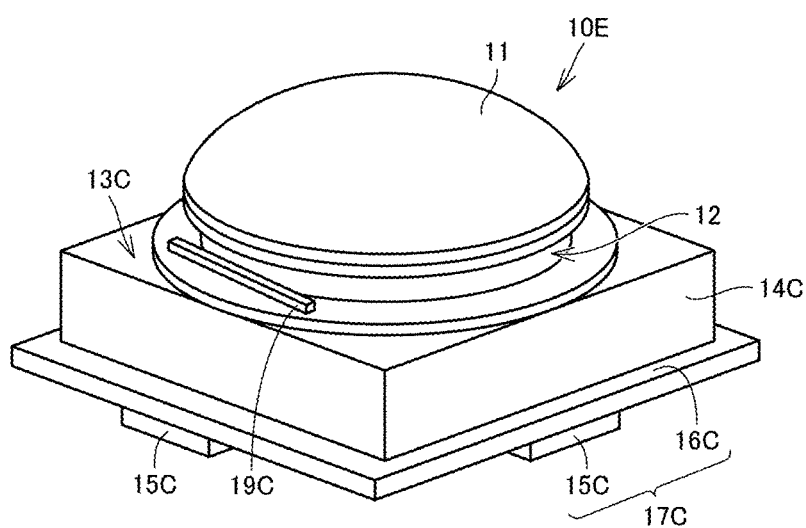
FIG. 15 is a perspective view of a vibration device according to Preferred Embodiment 4 of the present invention.

With reference to FIG. 15, Preferred Embodiment 4 will be described. Note that the same or corresponding components as those in Preferred Embodiment 1 are denoted by the same reference numerals, and the description thereof will not be repeated. The vibration device 10 according to Preferred Embodiment 1 has a circular or substantially circular shape when the first cylindrical body 12 is viewed from the axial direction (see FIG. 1). The vibration device 10D according to Preferred Embodiment 3 has a rectangular or substantially rectangular shape when the first cylindrical body 12B is viewed from the axial direction (see FIG. 14). On the other hand, a vibration device according to Preferred Embodiment 4 includes a member having a circular or substantially circular shape and a member having a rectangular or substantially rectangular shape, when the first cylindrical body is viewed from the axial direction. The vibration device according to Preferred Embodiment 4 is mounted on the imaging unit to be used in the same or substantially the same manner as the vibration device 10 according to Preferred Embodiment 1.

FIG. 15 is a perspective view of a vibration device 10E according to Preferred Embodiment 4. The vibration device 10E differs from the vibration device 10 in that when the first cylindrical body 12 is viewed from the axial direction, the protective cover 11 and the first cylindrical body 12 have a circular or substantially circular shape, whereas a plate spring 13C, a second cylindrical body 14C, and a vibrating body 17C have a rectangular or substantially rectangular shape. Further, the vibration device 10E differs from the vibration device 10 in that a plurality of piezoelectric elements 15C is provided along a shape of a vibrating plate 16C.

In the vibration device 10E, a weight 19C is provided on a portion of a boundary between the first cylindrical body 12 and the plate spring 13C. The weight 19C is provided at a portion of the first cylindrical body 12, instead of being provided on the entire or substantially the entire circumference thereof. Of course, as described in Preferred Embodiment 1, the vibration device 10E may include a cutout portion in a portion of the vibrating body 17C, instead of the weight 19C.

Even in vibration of the vibration device 10E according to Preferred Embodiment 4, similarly to the vibration of the vibration device 10C according to Preferred Embodiment 2, including the weight 19C, the protective cover 11 can be vibrated to be inclined in the piston vibration mode. Therefore, the vibration device 10E according to Preferred Embodiment 4 achieves the same or substantially the same advantageous effects as those of the vibration device 10. In addition, in the vibration device 10E, when the first cylindrical body 12 is viewed from the axial direction, since the plate spring 13C, the second cylindrical body 14C, and the vibrating body 17C have a rectangular or substantially rectangular shape, the member can be used without waste, and further the cutting can be easily performed, so that the manufacturing cost can be reduced.

Note that, in the vibration device 10E, when the first cylindrical body 12 is viewed from the axial direction, it is sufficient that the plate spring 13C, the second cylindrical body 14C, and the vibrating body 17C may have a rectangular or substantially rectangular shape, and may be a square, a rectangle, or a polygon, for example.

In addition, in the vibration device 10E, the plate spring 13C, the second cylindrical body 14C, and the vibrating body 17C have a rectangular or substantially rectangular shape when the first cylindrical body 12 is viewed from the axial direction, but the shape is not limited thereto, and it is sufficient that at least one of the protective cover 11, the first cylindrical body 12, the plate spring 13C, the second cylindrical body 14C, and the vibrating body 17C may have a rectangular or substantially rectangular shape when the first cylindrical body 12 is viewed from the axial direction.

In addition, in the vibration device 10E, the protective cover 11 and the first cylindrical body 12 have a circular or substantially circular shape when the first cylindrical body 12 is viewed from the axial direction, but the shape is not limited thereto, and it is sufficient that at least one of the protective cover 11, the first cylindrical body 12, the plate spring 13C, the second cylindrical body 14C, and the vibrating body 17C may have a circular or substantially circular shape when the first cylindrical body 12 is viewed from the axial direction.

Further, in the vibration device 10E, one sheet of piezoelectric element 15C having a change corresponding the shape of the vibrating plate 16C may be provided on a lower surface of the vibrating plate 16C. Further, the piezoelectric element 15C may be provided on an upper surface of the vibrating plate 16C.

As illustrated in the modified example of Preferred Embodiment 1, the vibrating body 17C may extend toward an inside of the vibration device 10E. Specifically, the vibrating plate 16C may extend inward from a position that supports a bottom surface of the second cylindrical body 14C, and the piezoelectric element 15C may be provided on the upper surface or the lower surface of the vibrating plate 16C.

In the vibration device according to the above-described preferred embodiments, it has been described that the protective cover is vibrated to be inclined in the piston vibration mode by providing a cutout portion in a portion of the vibrating body or by providing a weight on a portion of a boundary between the first cylindrical body and the plate spring. However, the location where the cutout portion is provided, and the location where the weight is provided are not limited thereto. FIGS. 16A to 16C and FIGS. 17A to 17C are diagrams for explaining a location where a cutout portion or a weight is provided.

Figure 16A:
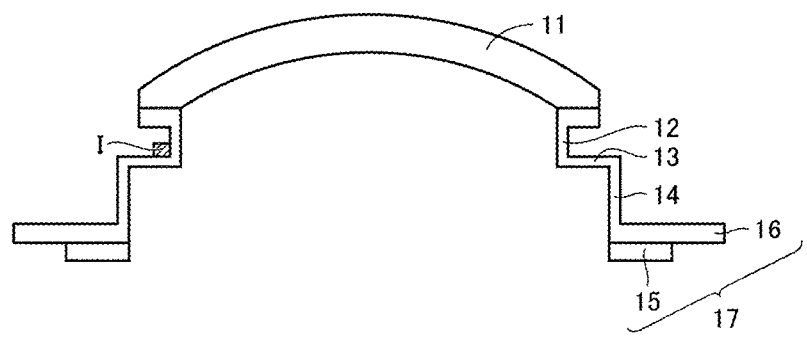
FIGS. 16A to 16C include diagrams for explaining a location where a cutout portion or a weight is provided.
Figure 16B:
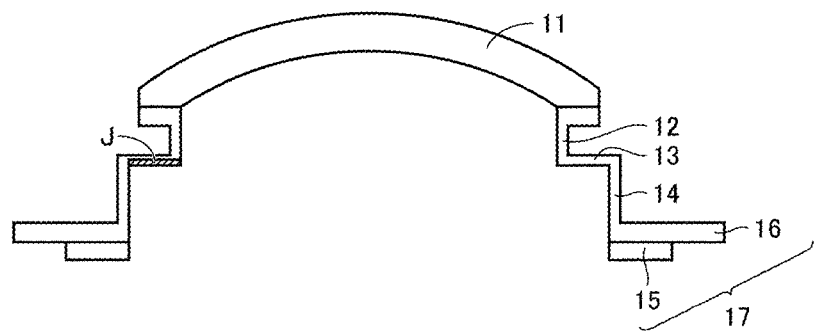
Figure 16C:
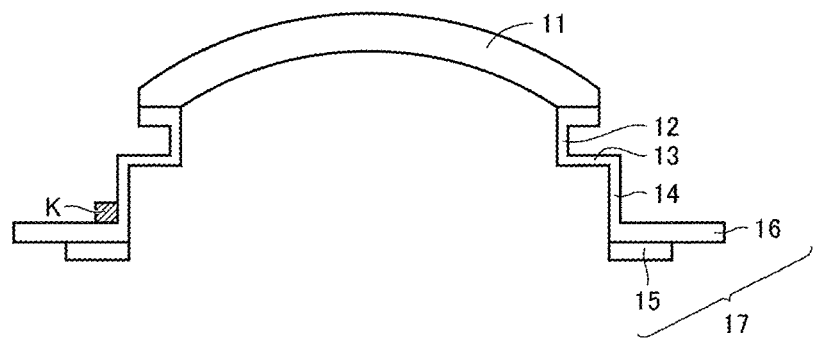
Figure 17A:
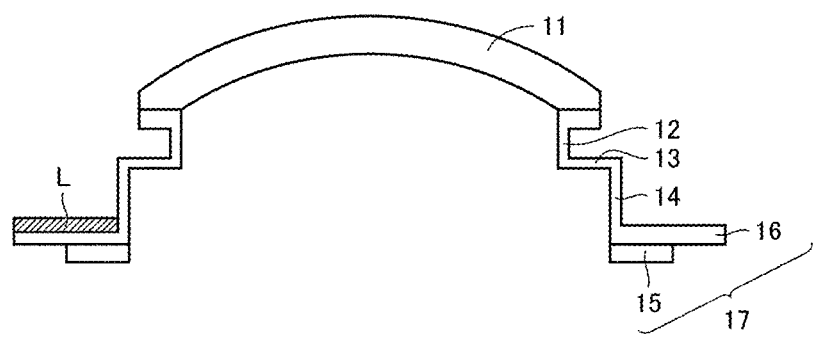
FIGS. 17A to 17C include diagrams for explaining a location where a cutout portion or a weight is provided.
Figure 17B:
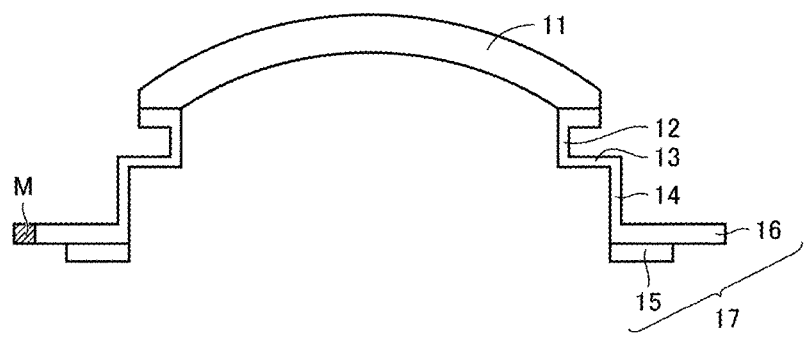
Figure 17C:
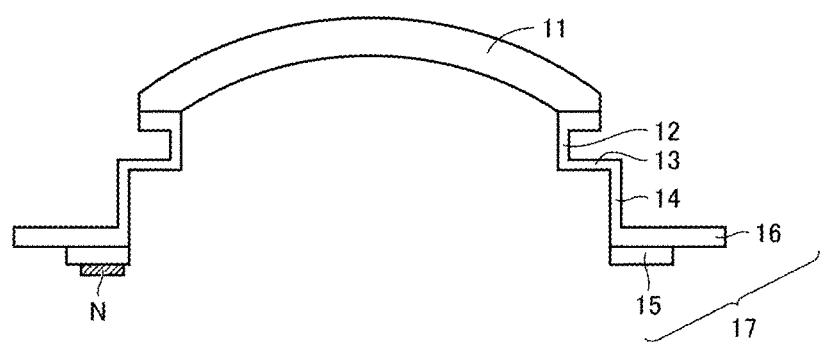

In FIG. 16A, a cutout portion or a weight is provided in a portion I of the boundary between the first cylindrical body 12 and the plate spring 13. In FIG. 16B, a cutout portion or a weight is provided in a portion J on a back surface of the plate spring 13. In FIG. 16C, a cutout portion or a weight is provided in a portion K of a boundary between the second cylindrical body 14 and the vibrating plate 16. In FIG. 17A, a cutout portion or a weight is provided in a portion L of a surface of the vibrating plate 16. In FIG. 17B, a cutout portion or a weight is provided at an end portion M of the vibrating plate 16. In FIG. 17C, a cutout portion or a weight is provided in a portion N of the piezoelectric element 15.

Note that the vibration device includes a cutout portion or a weight in at least one of the locations of the portion I to the portion N illustrated in FIGS. 16A to 16C and FIGS. 17A to 17C. In addition, the vibration device according to the above-described preferred embodiments has been described as examples in which the cutout portion or the weight is provided, but both of the cutout portion and the weight may be provided. For example, in the vibration device, a cutout portion may be provided in at least one of the locations of the portion I to the portion N illustrated in FIGS. 16A to 16C and FIGS. 17A to 17C, and a weight may be provided in at least one of the locations of the portion I to the portion N. Of course, a plurality of cutout portions may be provided in at least one of the locations of the portion I to the portion N, and a plurality of weights may be provided in at least one of the locations of the portion I to the portion N. Further, the cutout portion and the weight may be provided in the protective cover.

The imaging unit 100 according to the above-described preferred embodiment may include a camera, a LiDAR, a Rader, and the like, for example. In addition, a plurality of imaging units may be provided side by side.

The imaging unit 100 according to the above-described preferred embodiment is not limited to the imaging unit provided in a vehicle, and can be applied to any imaging unit that includes a vibration device and an imaging element arranged so that a light transmissive body is in the field of view, and that needs to remove foreign matter on the light transmissive body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
   a light transmissive body to transmit light with a predetermined wavelength;
   a first cylindrical body to hold the light transmissive body at one end;
   a plate-shaped spring portion to support another end of the first cylindrical body;
   a second cylindrical body to support, at one end, a portion of the spring portion in an outer side portion of a portion that supports the first cylindrical body;
   a vibrating body that is provided at another end of the second cylindrical body to vibrate in an axial direction of the second cylindrical body; and
   a non-equilibrium structure that removes a mass of a portion or adds a mass to a portion of at least one of the light transmissive body, the first cylindrical body, the second cylindrical body, the spring portion, and the vibrating body.

2. The vibration device according to claim 1, wherein the non-equilibrium structure includes a cutout portion that cuts out a portion of at least one of the light transmissive body, the first cylindrical body, the second cylindrical body, the spring portion, and the vibrating body.

3. The vibration device according to claim 1, wherein the non-equilibrium structure includes a weight provided on a portion of at least one of the light transmissive body, the first cylindrical body, the second cylindrical body, the spring portion, and the vibrating body.

4. The vibration device according to claim 1, wherein the vibrating body includes:
   a plate-shaped vibrating plate extending outward from the other end of the second cylindrical body; and
   a piezoelectric element provided on an upper surface or a lower surface of the vibrating plate.

5. The vibration device according to claim 1, wherein the vibrating body includes:
   a plate-shaped vibrating plate extending inward from the other end of the second cylindrical body; and
   a piezoelectric element provided on an upper surface or a lower surface of the vibrating plate.

6. The vibration device according to claim 1, wherein
   a resonant frequency of the light transmissive body is larger than a resonant frequency of the spring portion;
   an excitation circuit to vibrate the vibrating body is included; and the excitation circuit selectively excites a resonance of the light transmissive body and a resonance of the spring portion.

7. The vibration device according to claim 6, wherein a resonant frequency of the light transmissive body is equal to or more than about 1.2 times a resonant frequency of the spring portion.

8. The vibration device according to claim 6, wherein the excitation circuit drives the vibrating body so that the first cylindrical body and the second cylindrical body vibrate in opposite phase to each other in an axial direction.

9. The vibration device according to claim 1, wherein at least one of the light transmissive body, the first cylindrical body, the spring portion, the second cylindrical body, and the vibrating body has a circular or substantially circular shape when the first cylindrical body is viewed from an axial direction of the first cylindrical body.

10. The vibration device according to claim 1, wherein at least one of the light transmissive body, the first cylindrical body, the spring portion, the second cylindrical body, and the vibrating body has a rectangular or substantially rectangular shape when the first cylindrical body is viewed from an axial direction of the first cylindrical body.

11. The vibration device according to claim 1, wherein the light transmissive body has a dome shape.

12. The vibration device according to claim 1, wherein the light transmissive body has a plate shape.

13. The vibration device according to claim 1, wherein a thickness of the first cylindrical body is shorter than a length from a position of the spring portion that supports the first cylindrical body to a position of the spring portion that is supported by the second cylindrical body.

14. The vibration device according to claim 4, wherein in the vibrating body, the piezoelectric element is integrally provided along a shape of the vibrating plate.

15. The vibration device according to claim 4, wherein in the vibrating body, a plurality of the piezoelectric elements having a rectangular or substantially rectangular shape are provided along a shape of the vibrating plate.

16. An imaging unit comprising:
the vibration device according to claim 1; and
an imaging element arranged so that the light transmissive body is in a field of view direction.

17. The imaging unit according to claim 16, wherein the non-equilibrium structure includes a cutout portion that cuts out a portion of at least one of the light transmissive body, the first cylindrical body, the second cylindrical body, the spring portion, and the vibrating body.

18. The imaging unit according to claim 16, wherein the non-equilibrium structure includes a weight provided on a portion of at least one of the light transmissive body, the first cylindrical body, the second cylindrical body, the spring portion, and the vibrating body.

19. The imaging unit according to claim 16, wherein
the vibrating body includes:
a plate-shaped vibrating plate extending outward from the other end of the second cylindrical body; and
a piezoelectric element provided on an upper surface or a lower surface of the vibrating plate.

20. The imaging unit according to claim 16, wherein
the vibrating body includes:
a plate-shaped vibrating plate extending inward from the other end of the second cylindrical body; and
a piezoelectric element provided on an upper surface or a lower surface of the vibrating plate.

* * * * *